United States Patent [19]
Takahashi et al.

[11] Patent Number: 6,070,778
[45] Date of Patent: *Jun. 6, 2000

[54] WIRE BONDING APPARATUS AND CONTROL METHOD THEREOF

[75] Inventors: Kuniyuki Takahashi, Musashimurayama; Hijiri Hayashi, Nakano-ku, both of Japan

[73] Assignee: Kabushiki Kaisha Shinkawa, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/079,215

[22] Filed: May 14, 1998

[30] Foreign Application Priority Data

May 14, 1997 [JP] Japan ................................. 9-139342

[51] Int. Cl.⁷ .......................... B23K 37/00; B23K 13/08; B23K 15/02; B23K 31/00; B23K 31/02
[52] U.S. Cl. ............................. 228/4.5; 228/8; 228/102; 228/180.5
[58] Field of Search ..................... 228/102, 9, 4.5, 228/110.1, 180.5, 1.1, 8

[56] References Cited

U.S. PATENT DOCUMENTS

| | | |
|---|---|---|
| 4,597,519 | 7/1986 | Kurtz et al. .............................. 228/102 |
| 5,011,061 | 4/1991 | Funatsu ..................................... 228/1.1 |
| 5,060,841 | 10/1991 | Oshima et al. .......................... 228/102 |
| 5,158,223 | 10/1992 | Shimizu .................................... 228/1.1 |
| 5,207,370 | 5/1993 | Mochida et al. ........................ 228/102 |
| 5,443,200 | 8/1995 | Arikado ................................... 228/102 |
| 5,566,876 | 10/1996 | Nishimaki et al. ..................... 228/102 |
| 5,579,984 | 12/1996 | Sasano ..................................... 228/102 |
| 5,586,713 | 12/1996 | Arita et al. .............................. 228/102 |

FOREIGN PATENT DOCUMENTS

| | | |
|---|---|---|
| S58-184734 | 10/1983 | Japan . |
| H6-29343 | 2/1994 | Japan . |
| H6-18222 | 3/1994 | Japan . |
| H6-80697 | 10/1994 | Japan . |

*Primary Examiner*—Patrick Ryan
*Assistant Examiner*—Kiley Stoner
*Attorney, Agent, or Firm*—Koda & Androlia

[57] ABSTRACT

In a bonding method and apparatus, a bonding arm having a bonding tool at one end thereof is controlled to stop at a constant height position by a computer that incudes a memory containing positional deviation correction values which correct deviations at stopping positions of the bonding arm so that a bonding arm position controller is controlled by the positional deviation correction values.

2 Claims, 5 Drawing Sheets

WIRE BONDING APPARATUS AND CONTROL METHOD THEREOF

BACKGROUND OF THE INVENTION

1. Field of the Invention

The present invention relates to a wire bonding apparatus with a bonding arm supported so as to move upward and downward by an elastic member and also to a method for controlling the apparatus

2. Prior Art

A wire bonding apparatus in which the bonding arm is supported so as to be movable upward and downward and driven by an elastic member is shown in FIG. 4.

The bonding arm 2 of this bonding apparatus has a bonding tool 1 at one end thereof and is fastened to one end of a supporting frame 3. The supporting frame 3 is attached to a moving table 5 via a plate spring 4 which is assembled in the form of a cross, so that the supporting frame 3 is swingable upward and downward as shown by an arrow V, and a moving table 5 is mounted on an XY table 6. The coil 8 of a linear motor 7 is fastened to another end of the supporting frame 3, and the magnet 9 of this linear motor 7 is fastened to the moving table 5. A linear scale 10 is attached to the rear end (right-side end in FIG. 4) of the supporting frame 3.

Examples of a wire bonding apparatus of this type are described in Japanese Patent Application Pre-Examination Publication (Kokai) Nos. S58-184734 and H6-29343 and Japanese Examined Patent Application Publication (Kokoku) No. H6-80697.

With the structure described above, the supporting frame 3 and bonding arm 2 are caused to swing in the direction of arrow V about the cross-shaped plate spring 4 by the linear motor 7, and the bonding tool 1 is, as a result, moved up and down. Furthermore, the moving table 5, supporting frame 3, bonding arm 2 and bonding tool 1 are moved horizontally (or in X and Y directions) by the XY table 6. By way of the combination of the vertical movement and horizontal movement of the bonding tool 1 as described above, a wire 12 passing through the bonding tool 1 is connected between the first and second bonding points on the workpiece (not shown). In other words, a ball 13 formed at the tip end of the wire 12 is bonded to the first bonding point, and then the other portion of the wire 12 is bonded to the second bonding point During this bonding of the wire 12 to the first and second bonding points, a load or a bonding load is applied by the linear motor 7 so that the ball 13 and wire 12 is pressed against the bonding points on the workpiece by the bonding tool 1.

Next, the operation system for the above bonding apparatus and the control configuration of the linear motor 7 will be described.

The operation system substantially comprises an external input-output means 20 and a computer 21. The external input-output means 20 is used for inputting and outputting various types of information (required for the operation of the apparatus) with respect to the computer 21. The computer 21 comprises a control circuit 22, an operating circuit 23, a reference coordinate register 24 and a height position counter 26. The control circuit 22 controls the external input-output means 20, operating circuit 23, reference coordinate register 24 and height position counter 26.

In the reference coordinate register 24, the height position of the bonding arm 2 is stored. More specifically, the value of the height position is inputted into a position control circuit 30 as one position command. When the value is thus inputted, the position control circuit 30 compares a previous position command and a new position command and generates an amount of movement of the bonding tool based upon the difference between the two position commands. This amount of movement is transmitted to a motor driver 31 as a driving signal 33.

The motor driver 31 generates electric power which is used to move the bonding tool 1 to a designated height position in accordance with the driving signal 33. Generally, electric power is the product of voltage and current; therefore, actual control of the linear motor 7 can be accomplished by controlling either the voltage or current, or both. Accordingly, the following explanation describes the case where the driving current 35 (and not a driving voltage) that flows through the linear motor 7 is controlled. The circuit described in Japanese Examined Patent Application Publication (Kokoku) No. H6-18222 may be cited as an example of the circuit that controls the driving current. When the driving current 35 generated by the motor driver 31 is applied to the coil 8 of the linear motor 7, a driving force is generated; and as a result of this driving force, the supporting frame 3, bonding arm 2 and bonding tool 1 are caused to swing about the plate spring 4 (or moved up and down).

Furthermore, the height position counter 26 of the computer 21 counts signals from an encoder 32 which converts signals from the position sensor 11 into a signal format which can be inputted into the computer 21 and generates an actual height position of the linear scale 10. The computer 21 is provided beforehand with a ratio of the amount of movement of the bonding tool 1 in the vertical direction to the amount of movement of the linear scale 10 in the vertical direction, and a quantization coefficient of the position sensor 11, i. e., a coefficient which converts the amount of movement into an electrical signal. Accordingly, the actual height position of the bonding tool 1 is determined by calculating the value indicated by the height position counter 26 via the operating circuit 23 based upon the value described above. The term "height position of the bonding tool" refers to the height position at which the bonding tool 1 contacts the object to which a load is to be applied.

The bonding arm 2 and bonding tool 1 swing about a fulcrum 4a of the cross-shaped plate spring 4. Accordingly, it is desirable that the bonding tool 1 be in a vertical position; in other words, it is desirable that the bonding arm 2 be in a horizontal position when the bonding tool 1 contacts the bonding point. With the bonding arm 2 thus adjusted to a horizontal position, an instruction to place the bonding arm 2 in a horizontal position is sent to the computer 21 by the external input-output means 20. As a result of this instruction, the control circuit 22 sends control information for this purpose to the position control circuit 30 via the reference coordinate register 24; and from the position control circuit 30, a driving signal 33 which produces the driving current 35 is sent to the motor driver 31. On the basis of this driving signal 33, the motor driver 31 produces the driving current 35 of a specified polarity and magnitude and outputs this driving current 35 to the coil 8.

Instructions concerning the movement of the bonding arm 2 are thus transmitted from the computer 21 in this manner.

In the system wherein the supporting frame 3 is supported by the plate spring 4 so as to swing upward and downward as described above, when no driving current 35 flows through the coil 8 or when no driving force is generated in the linear motor 7, the bonding arm 2 stops at the equilibrium position B as shown in FIG. 5. The equilibrium position B is a balanced position where the driving force of the plate spring 4 and the weight balance of the bonding tool 1, bonding arm 2, supporting frame 3, coil 8 and linear scale 10, etc. are supported by the plate spring 4.

In other words, the driving force of the plate spring 4 in this case acts in a direction which causes the bonding arm 2 to return to the equilibrium position B. More specifically, when the bonding arm 2 is in a position A which is higher than the equilibrium position B, the plate spring 4 generates a driving force which pushes the bonding arm 2 downward toward the equilibrium position B; and when the bonding arm 2 is in a position C or D which is lower than the equilibrium position B, then the plate spring 4 generates a driving force which pushes the bonding arm upward toward the equilibrium position B.

The equilibrium position B varies according to the mechanical factors of the wire bonding apparatus; therefore, the bonding arm 2 in the equilibrium position B is not necessarily in a horizontal position. Here, the term "mechanical factors" refers to mechanical errors arising from the working precision, assembly, adjustment, etc. of the parts of the bonding head.

In cases where the output is caused to follow the command speed, etc. in ordinary motor speed control, a constant deviation (i. e., a deviation between the command value and the output which is generated after the output has reached a steady state with respect to elapsed time after passing through a transitional state) is always generated; accordingly, the control circuit is endowed with integrating characteristics (I-control) so that the constant deviation is controlled to zero. In other words, since the deviation is integrated, a cumulative output appears until the deviation reaches zero. However, the installation of an integrating means within the system results in the generation of a delay which affects the stability of the control system; accordingly, in the control shown in FIG. 4, since the stability of the control system is important, control with an integrating means installed in the control circuit is not performed. Consequently, because of external perturbation, the target height position of the bonding arm cannot be maintained, and deviations (positional deviations) occur. Incidentally, the term "I-control" refers to a control in which the value obtained by integrating the deviation between the command value and the fed-back output is taken as the amount of movement of the control system.

As the bonding arm 2 is displaced toward the upper position A which is higher than the balance position B, the driving force of the plate spring 4 which brings down the bonding arm 2 increases; on the other hand, as the bonding arm 2 is displaced toward the lower positions C and D which are lower than the balance position B, the driving force of the plate spring 4 which brings up the bonding arm 2 toward the balance position B increases. If a positional correction feedback which is sufficient to correct for the difference in the spring force of the plate spring 4 according to the positions A, C and D is performed, i. e., if the position feedback gain level is increased, the bonding arm 2 begins to vibrate above a certain level. Accordingly, the position feedback gain is lowered to a level at which no vibration occurs. However, if the position feedback gain level is lowered, it becomes impossible to completely correct the driving force of the plate spring 4 according to the height position, resulting in that a positional deviation occurs.

Recognition of the height position of the bonding tool 1 is accomplished by: detecting the amount of movement of the linear scale 10 in the vertical direction using the position sensor 11; counting the pulse signals 36, which is shown in FIG. 6($a$) and outputted by the encoder 32, via the height position counter 26, and then processing the result of this count by the operating circuit 23 through the control circuit 22. A, B, C and D in FIG. 6 indicate the height positions of the bonding arm 2 shown in FIG. 5.

However, as described above, the driving force of the plate spring 4 causes the bonding arm 2 to stop in the positions indicated by inverted triangles in FIG. 6($b$), ($c$) and ($d$), causing deviations in the stopping positions. Position A+1 indicates a position which is one pitch above position A, and position A−1 indicates a position which is one pitch below position A. Positions B+1, B−1, C+1 and C−1 have similar meanings. Furthermore, in regard to the stopping pitch (with the stopping pitch P (B) at position B used as a standard), the length of one pitch decreases as the stopping position moves upward or downward, because the driving force of the plate spring 4 also increases. Moreover, this variation in the length of one pitch is cumulative, and therefore, the amount of downward deviation increases as the stopping position moves upward, and the amount of upward deviation increases as the stopping position moves downward.

More specifically, the pitch between stops is as shown by Numerical Formulae 1 and 2 below. Furthermore, at position A, as shown in FIG. 6($b$), the driving force of the plate spring 4 acts in a direction which causes the bonding arm 2 to drop, so that the stopping position is shifted downward. At position B, as shown in FIG. 6($c$), the bonding arm 2 stops at a center point 37 between pulses, since this position is the balanced position. Meanwhile, at position C, as shown in FIG. 6($d$), the driving force of the plate spring 4 acts in a direction which causes the bonding arm 2 to rise, so that the stopping position is shifted upward.

[Numerical Formula 1]

P(B)>P(B+1)> . . . P(A−1)>P(A)>P(A+1)> . . .

[Numerical Formula 2]

P(B)>P(B−1)> . . . P(C+1)>P(C)>P(C−1)> . . .

Ordinarily, the stopping control of the height position of the bonding arm 2 or the bonding tool 1 causes the bonding arm 2 to stop at the center 37 between pulses of the pulse signal 36 outputted by the encoder 32. However, as described above, the driving force of the plate spring 4 causes the bonding arm 2 to stop in the positions indicated by the inverted triangles L, so that a shift in the stopping position occurs. Meanwhile, the precision with which the height position of the bonding tool 1 is recognized is determined by how precisely counting can be performed when the signal from the position sensor 11 is converted by the encoder 32 and counted by the height position counter 26; i. e., the precision of recognition is determined by the resolution; and this resolution varies according to the parts that make up the wire bonding apparatus and the circuit construction, etc. Accordingly, even if the position recognized by the computer 21 is accurate, a positional deviation between pulses may be generated depending on the height position.

SUMMARY OF THE INVENTION

Accordingly, the object of the present invention is to provide a bonding apparatus in which the bonding arm is stopped at a fixed position between the pulse signals that determine the height position of the bonding arm so that the pitch of the stopping position is constant even if the driving force for the bonding arm varies according to the height position of the bonding arm, thus making it possible to correct positional deviations.

In addition, the present invention also provides a method for controlling the bonding apparatus.

The apparatus of the present invention which solves the above-described problems is a wire bonding apparatus equipped with: a bonding arm which has a bonding tool at one end and is supported on a supporting frame driven by an elastic member so as to move upward and downward, a linear motor which raises and lowers the bonding arm, a position detection section which detects the height position of the bonding arm and converts this height position into an electrical signal, a computer which calculates the height position of the bonding tool by processing signals from the position detection section, and a position control section which maintains the height position of the bonding tool and controls the movement of the bonding tool; wherein the memory of the computer is stored with positional deviation correction values which correct deviations of the stopping positions in the height positions of the bonding tool and control the position control section.

The method of the present invention which solves the above-described problems is for a wire bonding apparatus equipped with a bonding arm which has a bonding tool at one end and is supported on a supporting frame driven by an elastic member so as to move upward and downward, a linear motor which raises and lowers the bonding arm, a position detection section which detects the height position of the bonding arm and converts this height position into an electrical signal, a computer which calculates the height position of the bonding tool by processing signals from the position detection section, and a position control section which maintains the height position of the bonding tool and controls the movement of the bonding tool, wherein positional deviation correction values which correct stopping position deviations in the height position of the bonding tool is stored in the memory of the computer, and the position control section is controlled based upon these positional deviation correction values, thus correcting deviations at stopping positions in the height positions of the bonding tool.

BRIEF DESCRIPTION OF THE DRAWINGS

FIG. 2 illustrates the output of the encoder in which FIG. 2(a) is an explanatory diagram of the pulse signal, and FIG. 2(b) is an explanatory diagram of the position signal;

FIG. 3 illustrates the pulse signals at respective positions of the bonding arm in which FIG. 3(a) is an explanatory diagram of the movement pulse train, and FIGS. 3(b) through 3(d) are enlarged explanatory diagrams of the pulses in the vicinity of positions A, B and C, respectively;

FIG. 6 illustrates the pulse signals at respective positions of the bonding arm in which FIG. 6(a) is an explanatory diagram of the movement pulse train, and FIGS. 6(b) through 6(d) are enlarged explanatory diagrams of the pulses in the vicinity of positions A. B and C, respectively.

DETAILED DESCRIPTION OF THE INVENTION

Figure 2:
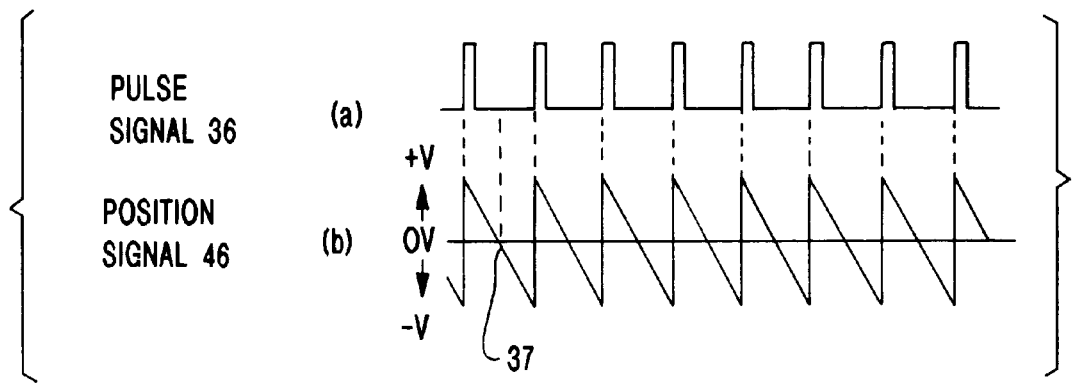
Figure 5:
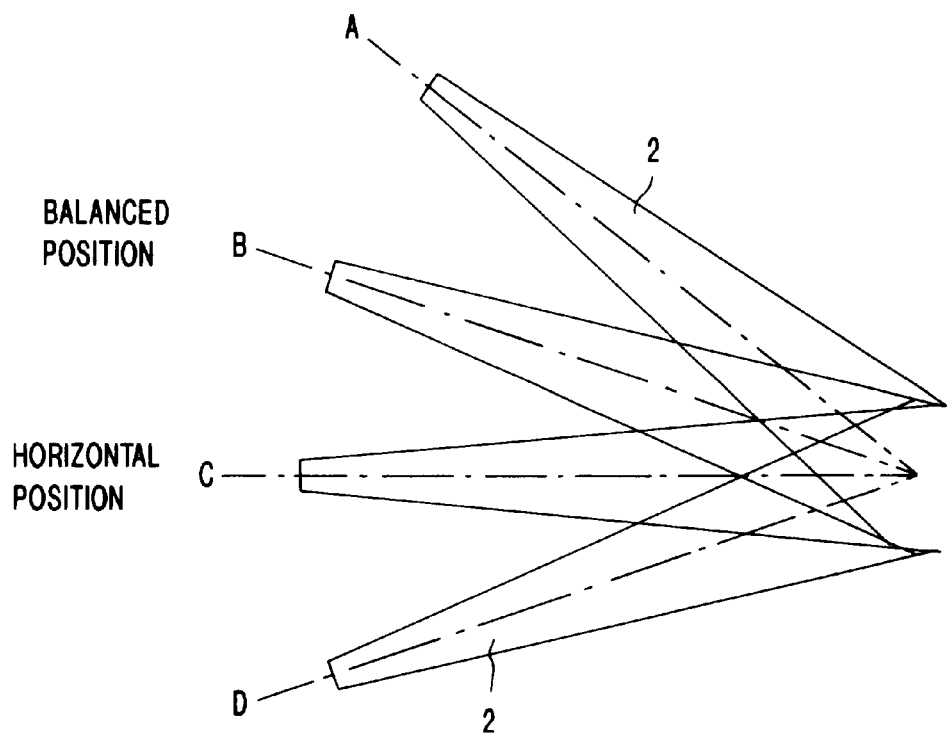
FIG. 5 is an explanatory diagram of respective positions of the bonding arm.
Figure 3:
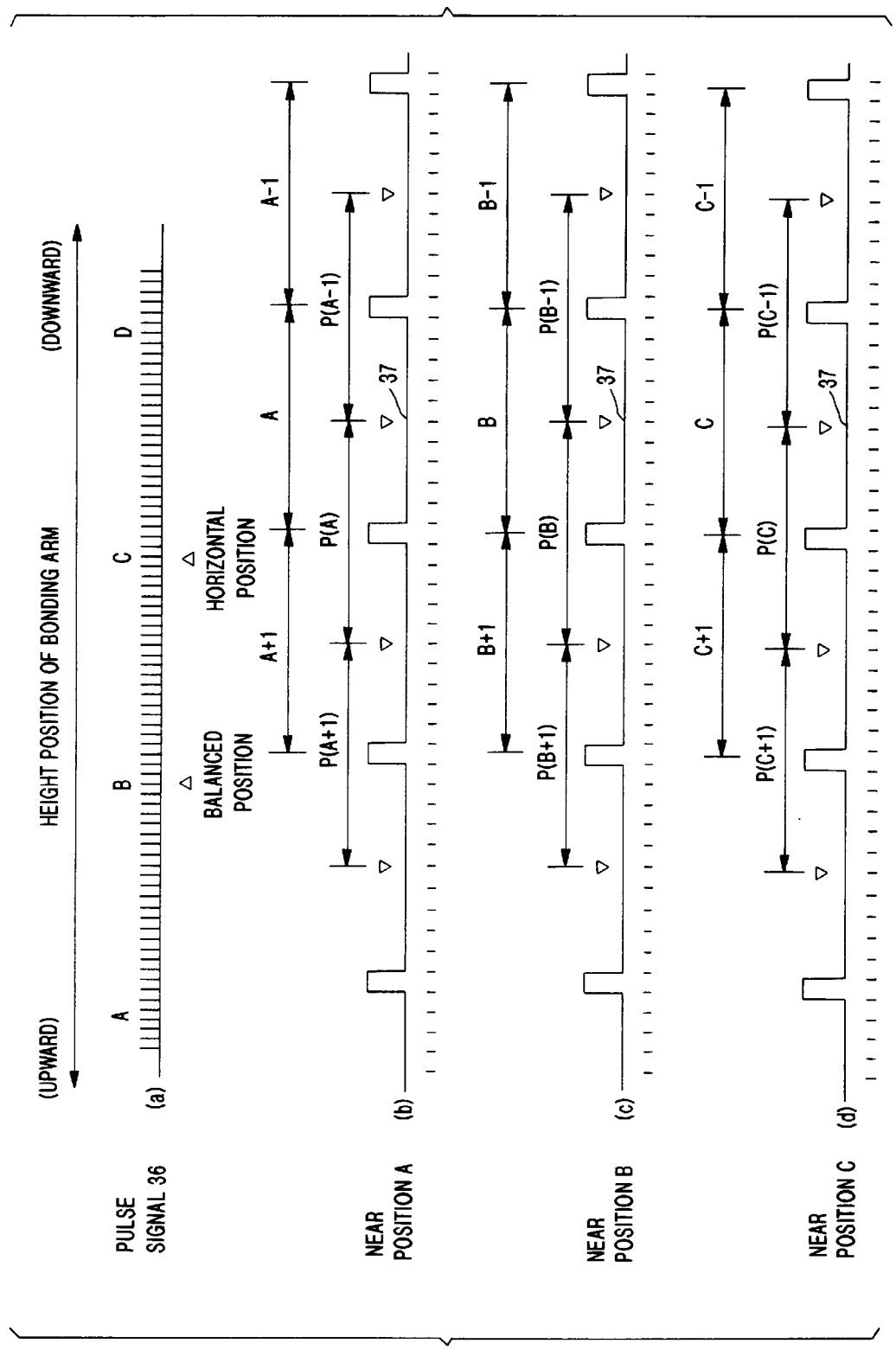
Figure 4:
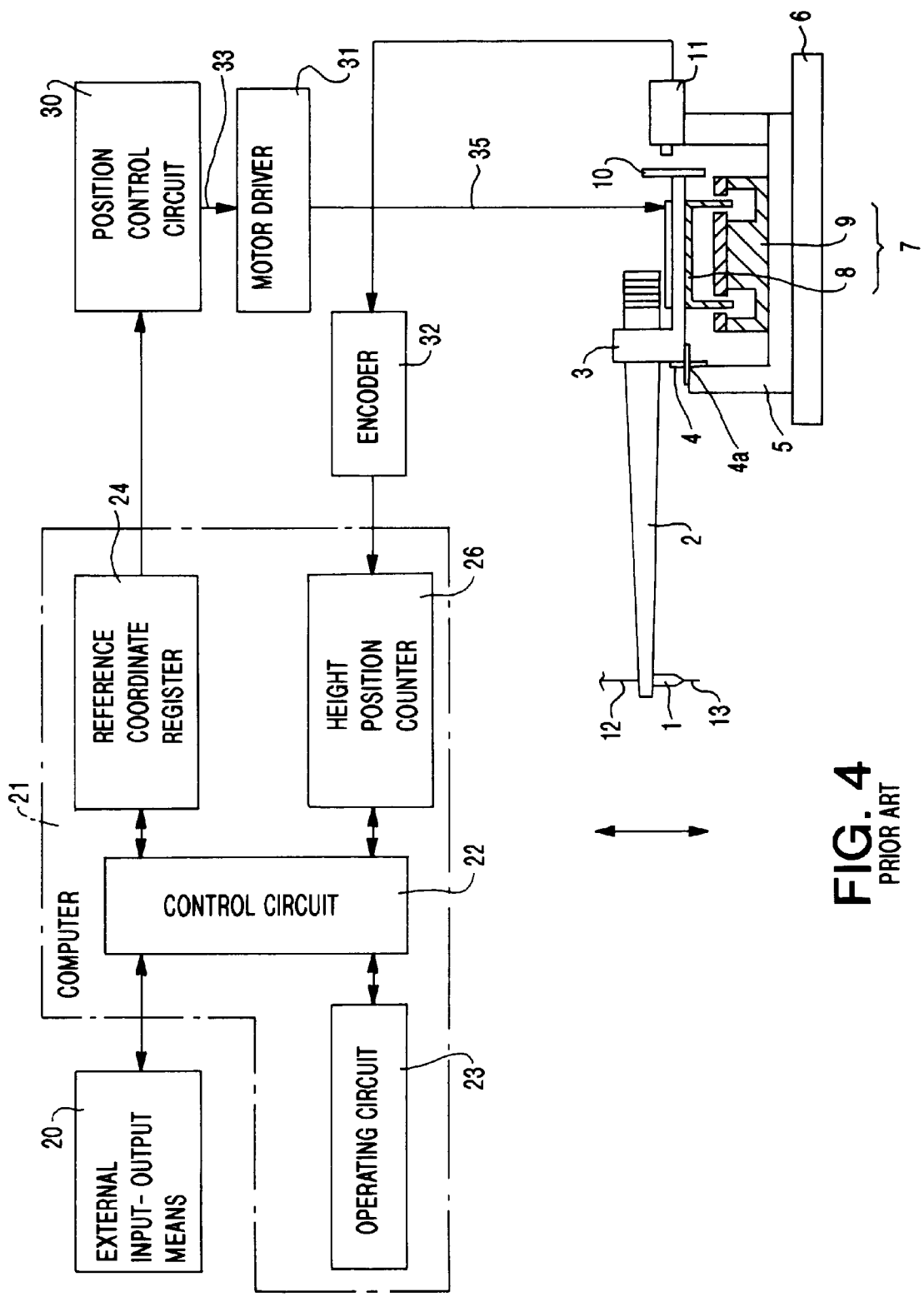
FIG. 4 is an explanatory diagram of a conventional wire bonding apparatus.
Figure 6:
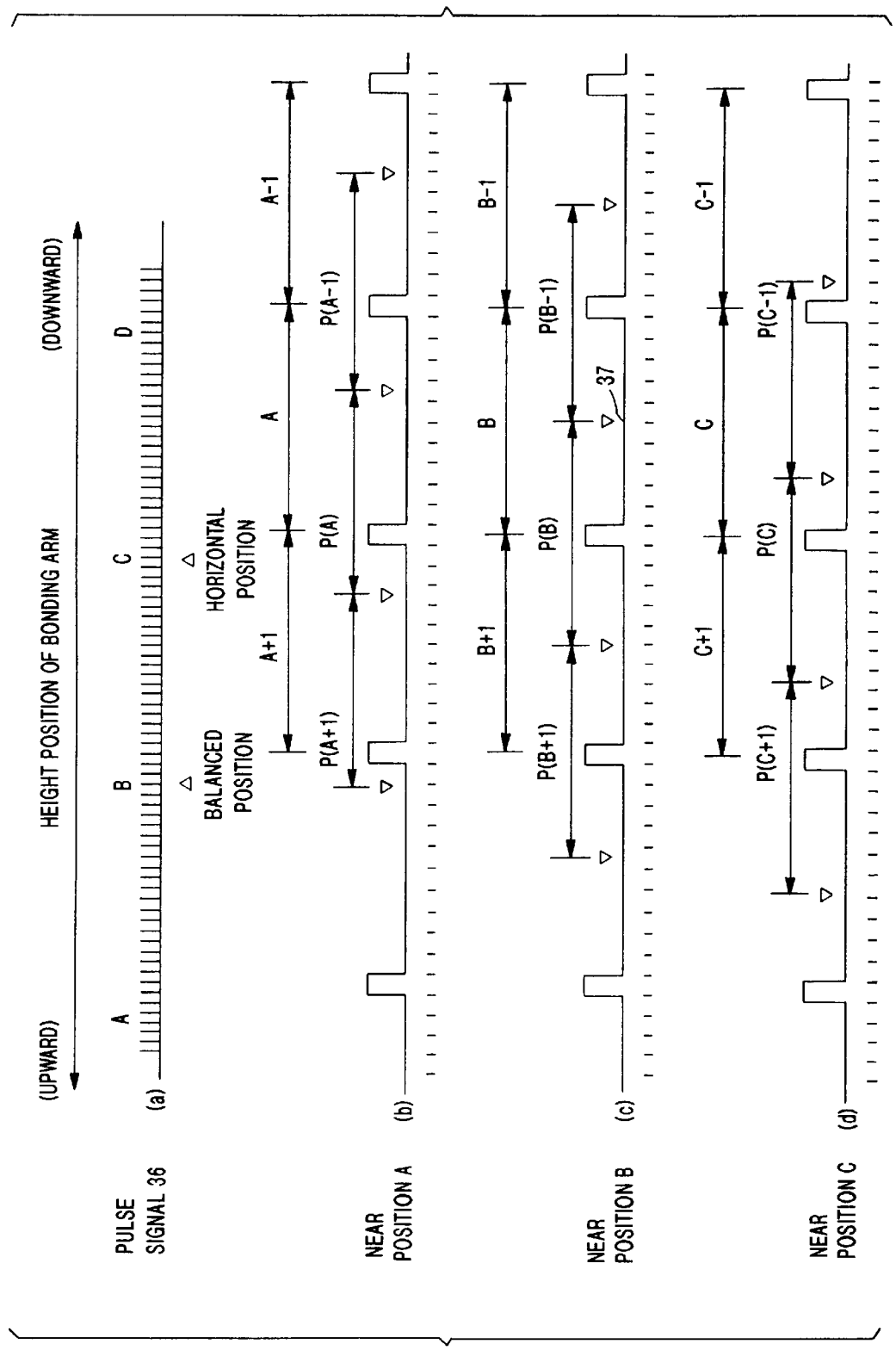

An embodiment of the present invention will be described with reference to FIGS. 1 through 3. Constituting elements which are the same as in FIGS. 4 through 6 or which correspond to those in FIGS. 4 through 6 are labeled with the same symbols, and a detailed description of such elements is omitted.

Figure 1:
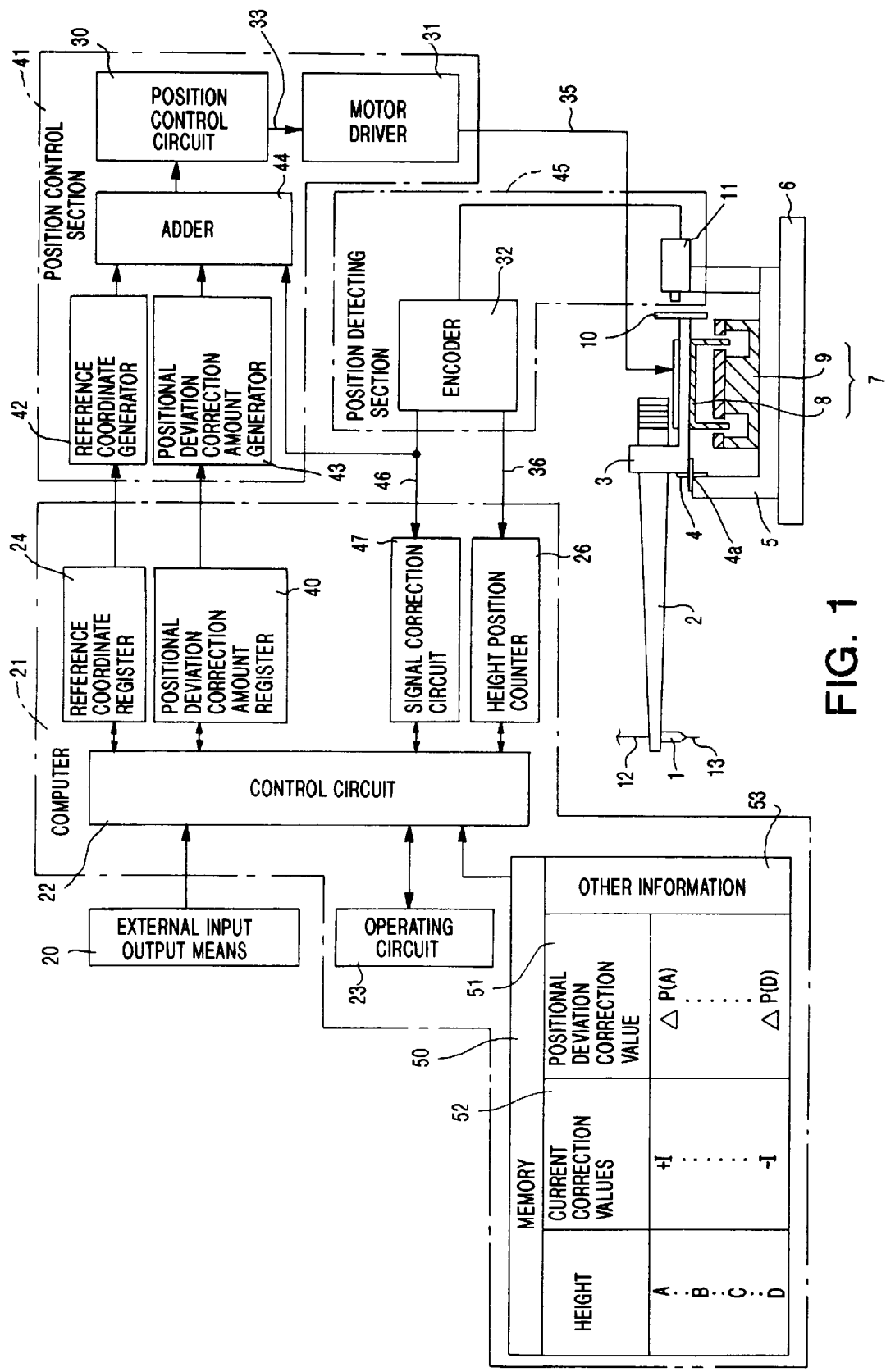
FIG. 1 is an explanatory diagram which illustrates one embodiment of the wire bonding apparatus of the present invention.

As shown in FIG. 1, in addition to a control circuit 22, an operating circuit 23, a reference coordinate register 24 and a height position counter 26, the computer 21 is provided with a positional deviation correction amount register 40, which stores amounts of movement smaller than the units specified by the reference coordinate register 24, as well as a signal conversion circuit 47 and a memory 50.

Furthermore, the position control section 41 which controls the linear motor 7 in accordance with commands from the computer 21 is, in addition to a position control circuit 30 and a motor driver 31, equipped with a reference coordinate generator 42 which subjects the output values from the reference coordinate register 24 to a D/A conversion, a positional deviation correction amount generator 43 which subjects the output values from the positional deviation correction amount register 40 to a D/A conversion, and an adder 44 which adds the output values from the reference coordinate generator 42 and the positional deviation correction amount generator 43 and outputs the result to the position control circuit 30.

Here, the reference coordinate generator 42 and the positional deviation correction amount generator 43 respectively convert the output values of the reference coordinate register 24 and positional deviation correction amount register 40 into a form that can actually be added by the adder 44.

Thus, the output value from the positional deviation correction amount generator 43 is added to the output value from the reference coordinate generator 42 by the adder 44, and the resulted control information is sent to the position control circuit 30.

A position detecting section 45 comprises an encoder 32 and a position sensor 11; and the encoder 32 converts signals from the position sensor 11 into pulse signals 36 shown in FIG. 2(a) and position signal 46 shown in FIG. 2(b). This position signal 46 is converted by the signal conversion circuit 47 of the computer 21 into a format that can be read by the control circuit 22 of the computer 21 and then inputted into the control circuit 22 with sufficient precision. Furthermore, the position signal 46 of the encoder 32 is also inputted into the adder 44 of the position control section 41. When the position signal 46 is expressed as a voltage as shown in FIG. 2(b), the portion extending from the rise of one pulse to the rise of the next pulse is expressed as "V, and the center point 37 is expressed as 0V. For example, in a case where the system is operated from a stopped state with the position signal 46 at 0V, and the stopping position following operation is not a position at 0V, then the corresponding voltage is fed back to the adder 44, and the output of the adder 44 is corrected by correction information from the positional deviation correction amount register 40 so that the position signal 46 returns to a position of 0V, thus causing the bonding arm (or bonding tool) to stop at a fixed position.

Accordingly, control of the stopping position of the bonding arm 2, i. e., the stopping position of the bonding tool 1 provided at one end of the bonding arm 2, is accomplished in the following manner:

In the stopped state in which position control is performed, the position signal 46 outputted by the encoder 32 is read in by the control circuit 22 through the signal conversion circuit 47. If it is detected as a result that a positional deviation has occurred (i. e., if the position signal 46 is not 0V), then the control circuit 22 of the computer 21 controls the positional deviation correction amount register 40 so that positional deviation correction information is sent out from the positional deviation correction amount register 40 so as to cause the position signal 46 to return to 0V; and this content is added to the adder 44 via the positional deviation correction amount generator 43. The content of the positional deviation correction amount register 40 in this case is stored among the positional deviation correction values 51 in the memory 50 of the computer 21. Thus, when the linear motor 7 is operated afterward, the control circuit 22 outputs a positional deviation correction value 51 to the positional deviation correction amount register 40 in accordance with the height position of the bonding tool 1. This positional deviation correction value 51 is stored, for instance, as $P(A)-P(B)=\Delta P(A)$ for position A, and as $P(D)-P(B)=\Delta P(D)$ for position D.

Thus, by performing the above operation either periodically or each time that the linear motor 7 is operated, it is possible to stop the bonding arm at the center point 37 between pulses as shown in FIGS. 3(b), (c) and (d), so that fluctuation in the stopping position of the bonding arm can be eliminated. Furthermore, the stopping position pitch in the vicinity of positions A to D is equal to the stopping position pitch P(B) at the balance position B, thus positional deviation in the stopping position pitch at the respective positions A through D can be eliminated.

The positional deviation correction values 51, current correction values 52 which are necessary in order to correct for the variation in the driving force of the plate spring 4, and other information 53 (i. e., the ratio of the amounts of vertical movement of the linear scale 10 and bonding tool 1, the quantizing coefficient for the position sensor 11, and the driving voltage of the linear motor 7, etc.) are stored in the memory 50 of the computer 21 as shown in FIG. 1 in accordance with the respective positions A, B, C and D of the bonding tool 1.

The above embodiment is for the structure in which the supporting frame 3 is supported by plate spring 4 so that the supporting frame 3 is swingable upward and downward. However, the present invention is not limited to this structure. For example, the invention can be used for a bonding apparatus in which a motor mounted on the bonding head (moving table) is used instead of a linear motor in a structure in which a tool arm (bonding arm) is fastened to an arm holder (supporting frame), the arm holder (supporting frame) is raised and lowered with a supporting shaft as a fulcrum, and the arm holder (supporting frame) is driven by a spring, as described in Japanese Patent Application Laid-Open (Kokai) No. H4-352336. In other words, since the stopping position of the tool arm (bonding arm) is caused to shift also by the driving force of the spring in cases where the coil of a linear motor is fastened to the arm holder (supporting frame) and the magnet of the linear motor is fastened to the bonding head (moving table), the present invention can be applied to such a structure.

As seen from the above, according to the present invention, since the stopping position deviation in the height position of the bonding tool is corrected in accordance with position signals, the bonding arm is stopped at a fixed position between the pulse signals that determine the height position, so that the pitch of the stopping position is constant even if the driving force varies according to the height position of the bonding arm, thus making it possible to correct the positional deviations.

What is claimed is:

1. A wire bonding apparatus comprising: a supporting frame, a bonding arm which has a bonding tool at one end and is supported on said supporting frame by an elastic member such that said bonding arm is pivotally movable upward and downward about said elastic member, a linear motor which raises and lowers the bonding arm, a position detection section which detects the height position of the bonding arm and converts this height position into electrical signal pulses, a memory, positional deviation correction values stored in said memory, a computer which calculates the height position of the bonding tool by processing said electrical signal pulses from the position detection section and corrects stopping position deviations in height positions in response to a selected positional deviation correction value stored in said memory, and a position control section which maintains the height position of the bonding tool and controls the movement of the bonding tool in response to output of said computer and wherein said elastic member comprises a cross-shaped spring.

2. A wire bonding apparatus comprising:
   a supporting frame, a bonding arm which has a bonding tool at one end and is supported on said supporting frame by an elastic member such that said bonding arm is pivotally movable upward and downward about said linear motor for generating pulses indicative of a height position of said bonding arm, a pulse counter for counting said pulses from said encoder, a memory, height position deviation correction values stored in said memory, a reference coordinate register which stores amounts of movement for the bonding arm smaller than the amounts of movement stored in said reference coordinate register, a computer for determining a height position of the bonding arm from a count in said pulse counter and commanding said reference coordinate register to output amounts of movement based upon said count, said computer further receiving position deviation correction values and commanding said position deviation correction amount register to output said smaller amounts of both said reference coordinate and position deviation correction amount register, and a position control section for controlling movement and position of said bonding tool in response to a sum in said adder and wherein said elastic member comprises a cross-shaped spring.

* * * * *